United States Patent [19]

You

[11] Patent Number: 5,471,480
[45] Date of Patent: Nov. 28, 1995

[54] PARALLEL TEST CIRCUIT FOR USE IN A SEMICONDUCTOR MEMORY DEVICE

[75] Inventor: Jei-Hwan You, Kyungki, Rep. of Korea

[73] Assignee: Samsung Electronics Co., Ltd., Suwon, Rep. of Korea

[21] Appl. No.: 50,779

[22] Filed: Apr. 22, 1993

[30] Foreign Application Priority Data

Apr. 22, 1992 [KR] Rep. of Korea .................... 6727/1992

[51] Int. Cl.$^6$ ......................... G01R 31/28; G01R 31/26; C11C 29/00

[52] U.S. Cl. ...................... 371/21.2; 371/21.1; 371/68.1; 365/201

[58] Field of Search ................................. 371/21.2, 21.1, 371/68.1; 365/201

[56] References Cited

U.S. PATENT DOCUMENTS

| | | | |
|---|---|---|---|
| 4,744,061 | 5/1988 | Takemaew et al. ..................... | 365/201 |
| 5,072,137 | 12/1991 | Slemmer ................................ | 307/465 |
| 5,072,138 | 12/1991 | Slemmer et al. ....................... | 307/465 |
| 5,075,892 | 12/1991 | Choy ..................................... | 382/61 |
| 5,265,100 | 11/1993 | McClure et al. ...................... | 371/21.2 |

OTHER PUBLICATIONS

Prince, "Semiconductor Memories", A Handbook of Design, Manufacture, and Application, Second Edition, pp. 697–716.

*Primary Examiner*—Robert W. Beausoliel, Jr.
*Assistant Examiner*—Alan M. Fisch
*Attorney, Agent, or Firm*—Charles R. Donohoe; Stephen R. Whitt

[57] ABSTRACT

A parallel test circuit is provided in a semiconductor memory chip for use during both a wafer test and a package test. The parallel test circuit operates to automatically reduce the number of test output pins associated with a single package test to thereby increase the number of packages that can be tested simultaneously. The parallel test circuit includes a selector for limiting the number of output pads which may be activated during a package test run. The selector is responsive to a wafer test enable signal, from a selection control circuit, to control output pad selection.

13 Claims, 3 Drawing Sheets

PARALLEL TEST CIRCUIT FOR USE IN A SEMICONDUCTOR MEMORY DEVICE

BACKGROUND OF THE INVENTION

1. Field of the Invention

The present invention relates to semiconductor memory devices, and more particularly to a parallel test circuit for testing memory devices.

2. Description of the Related Art

The ever increasing complexity of semiconductor components has been matched, in recent years, by similar developments in test and reliability philosophies and practices.

Historically, semiconductor memory testing was performed for a variety of reasons. Memory manufacturers perform tests to guarantee performance within predefined specifications and to screen out those components not meeting the specification.

Generally a plurality of memory cells are fabricated on a wafer, and then separated so as to be subjected to a packaging process. A self-test circuit, provided within the semiconductor memory device, has been used to evaluate the performance of memory cells.

The test of semiconductor memory devices is generally performed in two steps. The first step is performed in what is known as a wafer state (hereinafter referred to as wafer test), and the second step in what is known as a package state (hereinafter referred to as package test).

The wafer test is performed before separating the memory cells fabricated on the wafer to detect defective memory cells. An external detection terminal is directly coupled to each output pad of the test circuit which is provided in the memory device and fabricated on the wafer. Accordingly, defective cells are either removed or repaired.

After successful completion of the wafer test, memory cells are then subjected to a packaging process to generate an assembled final product. The package test is performed after the packaging process in order to remove those defective memory cells produced during the packaging process.

Because input/output pins of the memory device are connected to an output pad associated with a test circuit, a test board is generally used to connect such input/output pins to external detection terminals when performing the package test. Ordinarily, both wafer and package tests use a parallel test procedure which enables a plurality of memory cells to be tested simultaneously. Parallel test modes and practices are known, and have been described in some detail in "Semiconductor Memories: A Handbook of Design, Manufacture, and Application" 2nd Ed., by Betty Prince; John Wiley & Sons, pp. 698–717 (1991).

FIG. 2 schematically shows a conventional 16-bit parallel test circuit such as may be found in a 2 Mbyte×8 (i.e., 16 Mbit) dynamic random access memory (DRAM). A data output path is provided having 16 accessible data lines $DBi/\overline{DBi}$ (where i=0 to 15), eight 2-bit comparators, a $\phi$FTE signal input, 8 output buffers, and 8 output pads. FIG. 1 illustrates a conventional operational timing chart showing the relationship of parallel test enable signal $\phi$FTE (a controlling input to the parallel test circuit in FIG. 2) as a function of DRAM read/write control signals $\overline{WE}$, $\overline{CAS}$ and $\overline{RAS}$.

When row address strobe signal $\overline{RAS}$ transits from a logic 'high' state to a logic 'low' state, as would be the case after both column address strobe signal $\overline{CAS}$ and write enable signal $\overline{WE}$ are triggered logic 'low', then parallel test signal $\phi$FTE is triggered logic 'high' from a logic 'low' state. In this condition, test data output from memory cells is input, in parallel, to eight 2-bit comparators to perform an appropriate wafer or package test. Hence, parallel test enable signal $\phi$FTE serves as an enable control signal for the 2-bit comparators. Output signals from each of the comparators are transferred via output buffers to a corresponding output pad.

FIG. 3 shows a possible logic circuit of each of the 2-bit comparators shown in FIG. 2. As provided, each 2-bit comparator includes a first set of NAND gates and a second set of NOR gates. For this example, when input signals DB0 and DB1 are both at the same logic level, an output signal Dcom therefrom will be generated having a logic 'high' level. Conversely, when input signals DB0 and DB1 are not the same logic level, output signal Dcom will be at logic 'low' level. This provides a way to test for defective cells in a memory cell array quickly and accurately.

In the conventional test circuit of FIG. 2, test results will appear along the output pads of the memory device under test (during both the wafer and package tests). The test results at all output pads must necessarily be evaluated. Immediately after a wafer test, defective cells can be repaired if the addresses of defective cells are identifiable.

The entire operation of a memory device is tested again during the package test..This proves unnecessary and redundant. Nevertheless, test results at all available output pads are recorded and evaluated because test results are distributed over all output pads.

As a result, when a number of packages are subjected to a simultaneous parallel test, the number of memory cells that can be tested simultaneously, is in effect severely limited. Consequently, test costs increase as a result of too great a test time.

SUMMARY OF THE INVENTION

It is an object of the present invention to provide a parallel test circuit wherein a large number of memory cells can be tested simultaneously.

It is another object of the present invention to provide a parallel test circuit, for use during both a wafer test and a package test, that automatically reduces the number of test output pins associated with a single package test and thereby increase the number of packages that can be tested simultaneously.

According to the present invention, a parallel test circuit of a semiconductor memory device includes a selector that limits the number of output pads which may be activated during a package test run. The selector responds to a wafer test enable signal from a selection control circuit to control output pad selection.

BRIEF DESCRIPTION OF THE ATTACHED DRAWINGS

For a better understanding of the invention, reference will now be made, by way of example, to the accompanying diagrammatic drawings, in which.

DETAILED DESCRIPTION OF THE PREFERRED EMBODIMENTS

Figure 4:
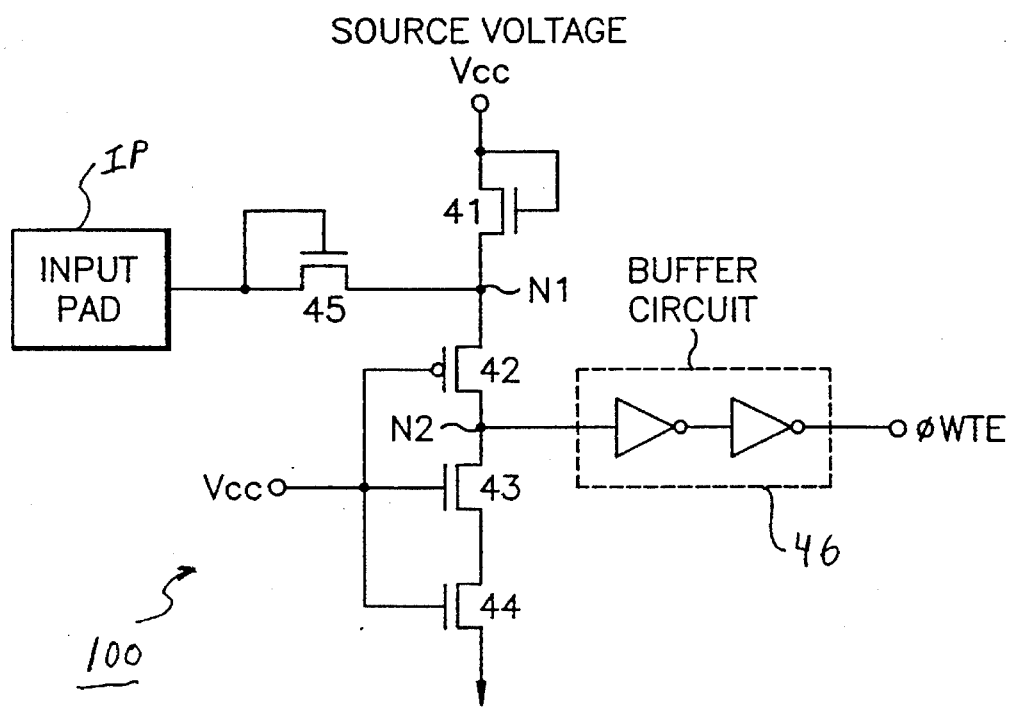
FIG. 4 is a block diagram of a parallel test circuit for use in a memory device according to the present invention.

FIG. 4 illustrates a selection control circuit 100 that selectively activates output pads in a parallel test circuit by generating a wafer test enable signal φWTE.

Selection control circuit 100 includes a first N-channel metal oxide semiconductor (NMOS) transistor 41 connected between a source voltage Vcc and an input node N1, its gate connected to source voltage Vcc. Also, a first P-channel metal oxide semiconductor (PMOS) transistor 42 connects input node N1 to output node N2, its gate connected to source voltage Vcc. Second NMOS transistor 43 has one terminal connected to output node N2 and its gate to source voltage Vcc. Third NMOS transistor 44 connects the other terminal of second NMOS transistor 43 to ground, its gate also being connected to source voltage Vcc.

Selection control circuit 100 also includes an output terminal φWTE, connected to a two-inverter buffer circuit 46 which is connected to output node N2. Input pad IP receives an externally applied voltage. A conducting channel of fourth NMOS transistor 45 connects the input pad to input node N1. The gate of fourth transistor 45 also connects to input pad IP.

When the external voltage exceeds Vcc+ 3 Vt (Vt being the approximate threshold voltage of the NMOS transistors), first NMOS transistor 41 turns off while fourth NMOS transistor 45 turns on. A voltage of Vcc+2 Vt appears at input node N1. In turn, first PMOS transistor 42 turns on. In this state, the voltage at output node N2 is a function of the sizes of the second and third NMOS transistors 43 and 44. The output node N2 will transit to approximately Vcc and appear as a logic 'high' signal.

Conversely, when the external voltage does not exceed Vcc∓Vt, input node N1 will settle to voltage level Vcc-Vt, causing first PMOS transistor 42 to turn off. Output node N2 transits to a logic 'low' voltage signal because second and third NMOS transistors 43 and 44 turn on in response to source voltage Vcc.

The stimulus signal is applied to input pad IP by direct external contact with an appropriate test probe during a wafer test. During the package test, input pad IP is not connected to any such external stimulus. Hence, no super voltage (Vcc∓Vt) is present at input pad IP during this test period.

Figure 1:
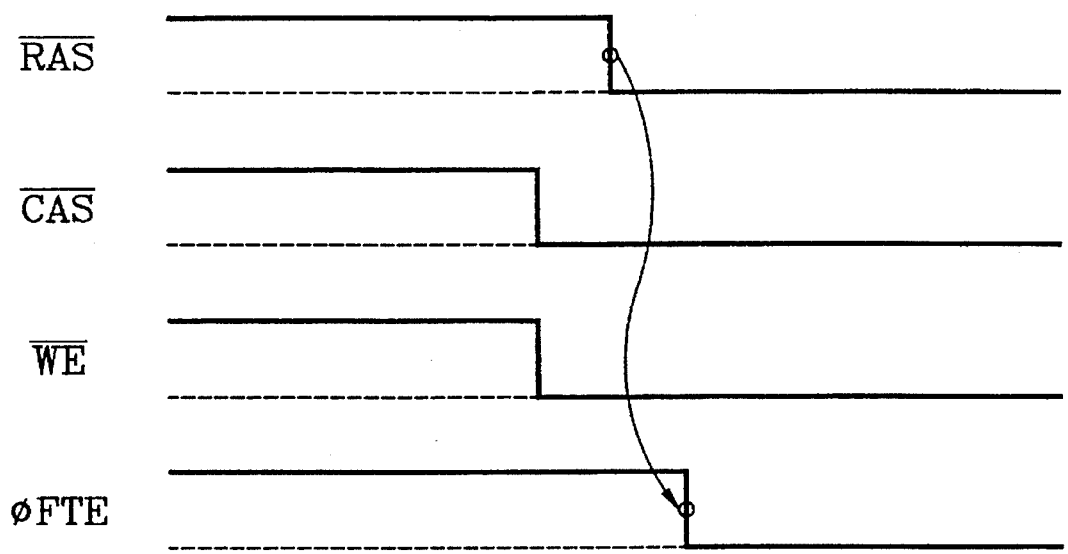
FIG. 1 is the operational timing diagram for generating a parallel test enable signal $\phi$FTE.
Figure 5:
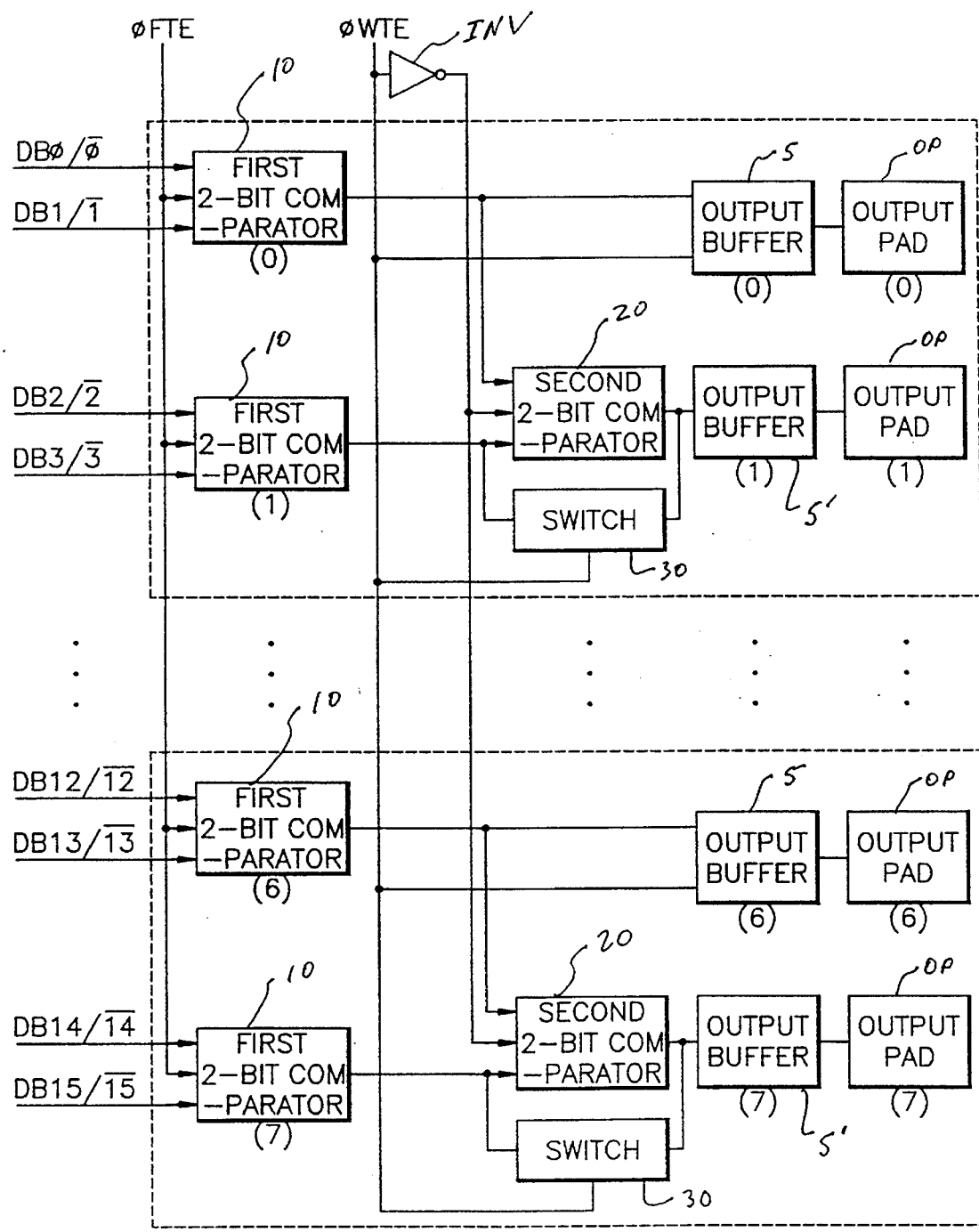
FIG. 5 is a circuit diagram for generating a wafer test enable signal φWTE according to the present invention.

FIG. 5 is a block diagram of a 16-bit parallel test circuit for testing a 16 Mbit DRAM having 16 accessible data lines DBi (i=0 to 15). The circuit has eight 2-bit comparators 10, each receiving two respective data line inputs DB0, DB1 corresponding inverting signals DB0, DB1. Each comparator also receives control signal φFTE which is initiated by the Write Enable WE and CAS before RAS in the sequence shown in FIG. 1.

In addition, the circuit includes four 2-bit comparators 20 responsive to a wafer test enable signal φWTE from selection control circuit 100. Four switches 30 (NMOS switching transistors) controlled by wafer test signal φWTE, bypass the 2-bit comparators 20. A first set of four output buffers 5 receive the outputs of first comparators. A second set of four output buffers 5' receive the outputs of second 2-bit comparators 20, and eight output pads OP respectively connect to the outputs of each of said first and second sets of four output buffers 5 and 5'.

Figure 2:
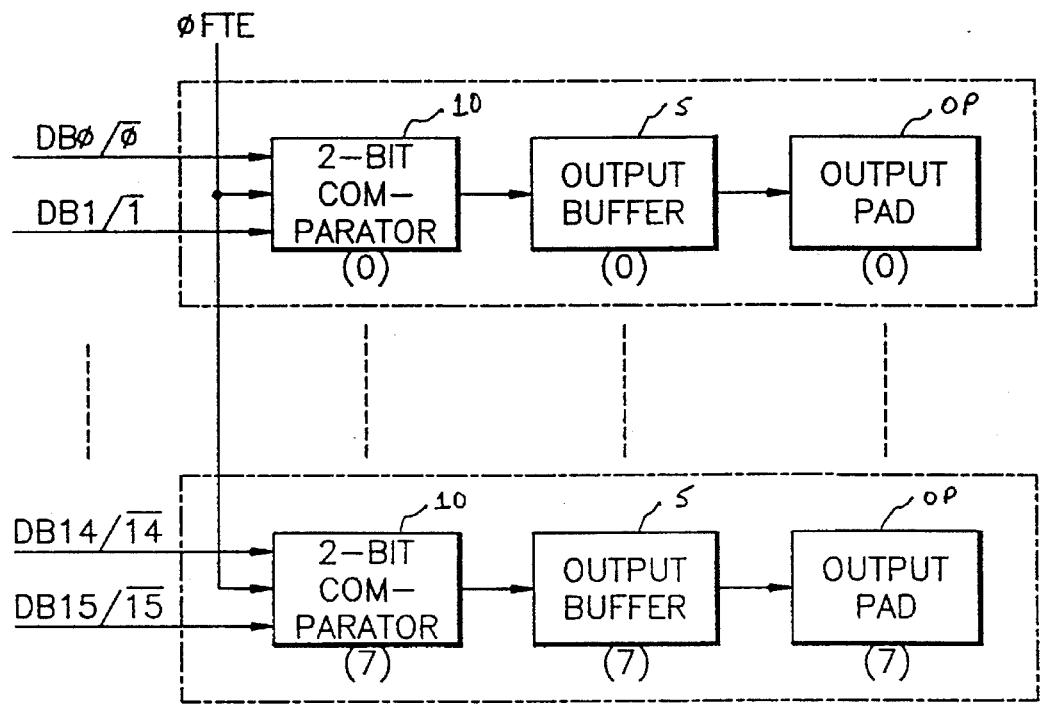
FIG. 2 is a block diagram of a conventional parallel test circuit for use in a memory device.
Figure 3:
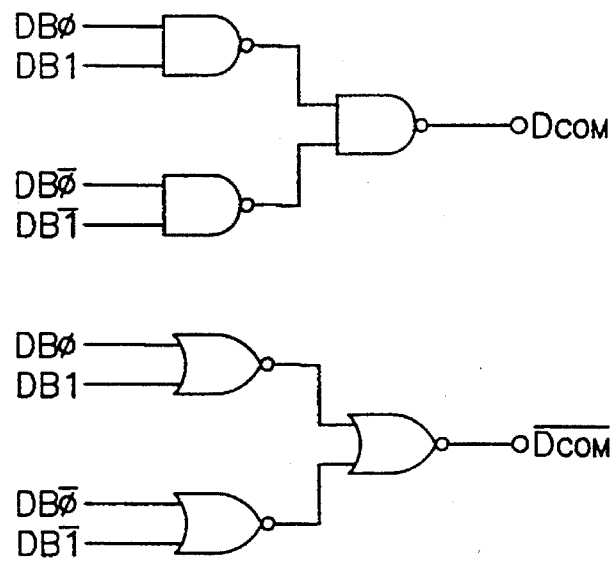
FIG. 3 is a logic circuit for the conventional 2-bit comparator shown in FIG. 2.

During a wafer test, a voltage of Vcc∓Vt is applied to the input pad IP to generate a wafer test signal voltage φWTE level equal to logic 'high' state. In this mode, the parallel test circuit of FIG. 5 will behave as does the conventional parallel test circuit shown in FIG. 2. Accordingly, a logic 'high' test signal φFTE will drive first 2-bit comparators 10.

In turn, an inverted wafer test signal (logic low) disables the second 2-bit comparators 20. Switches 30 become operational to connect outputs from the first 2-bit comparators 10 to the corresponding output buffers 5'. Consequently, all the outputs of the first 2-bit comparators 10 are transferred to their respective output buffers and generate data output signals at each of the output pads OP.

In the package test, wafer test signal φWTE becomes a logic 'low' state because input pad IP of selection control circuit 100 is intentionally not supplied with an external voltage signal. As previously, when test signal φFTE becomes logic 'high' here again all first 2-bit comparators 10 will become activated. However, second 2-bit comparators 20 become activated. Switches 30 turn off because wafer test signal φWTE is logic 'low'. Output buffers 5 are disabled by a logic 'low' wafer test signal. Accordingly, disabled output pads 5 produce no signals during a package test. The only signals generated are those from second 2-bit comparators 20 in response to outputs from corresponding pairs of first 2-bit comparators 10.

In the parallel test circuit described above in connection with FIG. 5, second 2-bit comparators 20 selectively limit the number of output pads which are necessarily activated during a package test. Second 2-bit comparators 20 are disabled and bypassed during wafer testing so as to make available all existing output pads. As a result, the reduced number of activated output pads during a package test frees up output test pins, which can be used to simultaneously package-test other similarly assembled. Thus, test time is significantly improved. A convenient aspect of this invention is the fact that, additional package testing is possible without the need for any additional complex timing requirements and control signals because wafer test signal φWTE automatically converts to logic 'low' state during the package test.

FIG. 5 is directed to one embodiment of the present invention wherein the number of output pads is selectively reduced to four in a parallel test circuit capable of 16-bit wafer testing. It should be readily apparent, however, that the number of output pads can be easily reduced to one. In such an embodiment (not shown), numerous stages of second 2-bit comparators 20 and switches 30, can be cascadedly connected to feed a single output buffer/pad.

It should also be readily apparent that if the semiconductor memory device under test is a byte-wide memory device having a large number of input/output pins (e.g., ×16 or ×32), then it would not be very difficult to devise a parallel test circuit having 'multi-bit' comparators (e.g., 4-bit or 8-bit comparators) as substitutes for the second 2-bit comparators whose operation was described in connection with FIG. 5. This will lead to a yet further reduction in the number of desired output pins for which one can conduct a memory cell test during package testing. Ultimately, the parallel test circuit, according to the present invention, reduces costs associated with testing constraints of highly integrated semiconductor memory devices.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A parallel test circuit for use in a semiconductor memory chip, comprising:

a plurality of first comparators, each coupled to receive test data on a plurality of bit lines, each generating a comparison output in response to received data and in response to a test enable signal;

a first set of output buffers coupled to receive a first set of outputs from first ones of said first comparators;

a second set of output buffers coupled to selectively receive one of a) a second set of outputs from remaining ones of said first comparators or b) a third set of outputs from a corresponding plurality of second comparators;

said plurality of second comparators coupled to generate said third set of outputs in accordance with corresponding ones of said first set of outputs and corresponding ones of said second set of outputs; and switching means, responsive to a selection signal, which causes either said second set of outputs generated from said remaining ones of said first comparators said third set of outputs generated from said second comparators to be outputted to said second set of output buffers.

2. The parallel test circuit of claim 1, wherein said plurality of second comparators are activated to generate said third set of outputs, at which time said first set of output buffers become disabled and at least one of said second set of output buffers receive said third set of outputs.

3. The parallel test circuit of claim 2, wherein said plurality of second comparators are selectively bypassed such that said second set of outputs from the remaining ones of said first comparators are driven to said second set of output buffers by said switching means.

4. The parallel test circuit of claim 2, wherein said second comparators are multi-bit comparators.

5. The parallel test circuit of claim 2, wherein said second comparators are formed in cascaded stages.

6. The parallel test circuit of claim 1, wherein said plurality of second comparators are selectively bypassed to drive said second set of outputs from the remaining ones of said first comparators to said second set of output buffers.

7. The parallel test circuit of claim 6, wherein said selection control circuit comprises:

a first N-channel MOS transistor connected between a source voltage and an input node, with a gate connected to said source voltage;

a first P-channel MOS transistor connected between said input node and an output node, with a gate connected to said source voltage;

a second N-channel MOS transistor with one terminal connected to said output node, with a gate connected to said source voltage;

a third N-channel MOS transistor connected between a second terminal of said second N-channel MOS transistor and ground voltage, with a gate connected to said source voltage;

an output terminal, coupled to said output node via a buffer circuit, for outputting said selection signal;

an input pad for receiving said externally applied voltage; and a fourth N-channel MOS transistor connected between said input pad and said input node, with a gate connected to said input pad.

8. The parallel test circuit of claim 1 wherein said switching means receives said selection signal from a selection control circuit, said selection control circuit generating an appropriate level of said selection signal as a function of whether a selected mode is one of a wafer test mode or a package test mode.

9. The parallel test circuit of claim 8, wherein said selection control circuit generates a first voltage level of said selection signal in response to an externally applied voltage during said wafer test mode, and wherein no externally applied voltage is provided to said selection control circuit during package test mode as the selection control circuit automatically defaults to package test mode to generate a second voltage level of said selection signal.

10. The parallel test circuit of claim 1, wherein said switching means comprises N-channel MOS transistors having their control gates coupled to said selection signal.

11. The parallel test circuit of claim 1, wherein said second comparators are multi-bit comparators.

12. The parallel test circuit of claim 1, wherein said second comparators are formed in cascaded stages.

13. A selection control circuit in a semiconductor memory device, responsive to an externally provided voltage signal during wafer test mode, to generate a wafer test enable signal to a parallel test circuit, said selection control circuit comprising:

a first N-channel MOS transistor connected between a source voltage and an input node, with a gate connected to said source voltage;

a first P-channel MOS transistor connected between said input node and an output node, with a gate connected to said source voltage;

a second N-channel MOS transistor with one terminal connected to said output node, with a gate connected to said source voltage;

a third N-channel MOS transistor connected between a second terminal of said second N-channel MOS transistor and ground voltage, with a gate connected to said source voltage;

an output terminal, coupled to said output node via a buffer circuit, for outputting said wafer test enable signal;

an input pad for receiving said externally applied voltage; and a fourth N-channel MOS transistor connected between said input pad and said input node, with a gate connected to said input pad.

* * * * *